(12) United States Patent
Yasuda

(10) Patent No.: US 7,871,932 B2
(45) Date of Patent: Jan. 18, 2011

(54) MANUFACTURING METHOD OF SEMICONDUCTOR DEVICE

(75) Inventor: Satoshi Yasuda, Toyama (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 12/144,122

(22) Filed: Jun. 23, 2008

(65) Prior Publication Data

US 2008/0318347 A1    Dec. 25, 2008

(30) Foreign Application Priority Data

Jun. 25, 2007    (JP)    ............................ 2007-165792

(51) Int. Cl.
*H01L 21/302* (2006.01)
(52) U.S. Cl. .................................... 438/689
(58) Field of Classification Search ........................ None
See application file for complete search history.

(56) References Cited

U.S. PATENT DOCUMENTS 5,508,934 A * 4/1996 Moslehi et al. ............. 700/121

6,855,916 B1 * 2/2005 Matthews et al. ........... 219/390

FOREIGN PATENT DOCUMENTS

| JP | 2006-190795 | 7/2006 |
| JP | 2007-059945 | 3/2007 |

* cited by examiner

*Primary Examiner*—Charles D Garber
*Assistant Examiner*—Andre' C Stevenson
(74) *Attorney, Agent, or Firm*—McDermott Will & Emery LLP

(57) ABSTRACT

In the semiconductor device manufacturing method of the present invention, first, the emissivity of a wafer placed in a chamber is measured. Then, the fluctuation rate of a wafer physical quantity that fluctuates in association with the given thermal energy is calculated based on an estimate expression, which are obtained in advance, presenting the relationship between the thermal energy quantity emitted from the heat source for heating the wafer, wafer emissivity and the wafer physical quantity fluctuation rate and on the measured emissivity. Subsequently, the processing time for the physical quantity to be a specific value is calculated based on the calculated fluctuation rate. Then, the thermal process is conducted for the calculated processing time.

12 Claims, 9 Drawing Sheets

MANUFACTURING METHOD OF SEMICONDUCTOR DEVICE

CROSS-REFERENCE TO RELATED APPLICATION

The present application claims the benefit of Japanese Patent Application No. 2007-165792 filed Jun. 25, 2007, the subject matter of which is incorporated herein by reference.

BACKGROUND OF THE INVENTION

1. Field of the Invention

The present invention relates to a semiconductor device manufacturing method for controlling the film thickness or impurity concentration distribution with accuracy in a semiconductor device manufacturing apparatus in which oxide films are formed on semiconductor wafers and injected impurities are activated, thereby reducing variation in the production of semiconductor devices and improving the production yield.

2. Description of the Related Art

As semiconductor device design rules are further detailed, more accurate controls are required on thin films formed on semiconductor wafers and ultra shallow junctions (USJs) of doped impurities. Furthermore, as semiconductor wafers have larger diameter bores, controls are required for more uniform film formation and impurity concentration distribution over the wafer surface. For example, the insulating film at a gate electrode should be controlled with accuracy in the order of several nanometers over the wafer surface and between wafers. To this end, the semiconductor device manufacturing apparatus periodically processes data obtained from process monitors formed on a semiconductor wafer and measures the formed film thickness and impurity concentration distribution (generally substituted by the sheet resistance of the wafer surface), and analyzes the obtained data, thereby monitoring changes in the manufacturing apparatus condition.

However, as semiconductor devices are further downsized, slight changes in the manufacturing apparatus condition affect the outcome of the manufacturing process in the manufacturing apparatus, making it difficult to realize a stable process by controlling only the manufacturing apparatus. For example, in an oxide film forming apparatus, even if wafers are controlled for the same temperature, actually formed oxide films are different in thickness depending on the condition of the film forming apparatus. In such a case, a process control (APC: Advanced Process Control) may be used for measuring the oxide film thickness of a process monitor and adjusting the processing time based on the film thickness to obtain a target film thickness.

For example, the Japanese Laid-Open Patent Publication No. 2007-59945 discloses an APC method wherein a process controller is provided in manufacturing apparatuses having a furnace used for thermal processing, such as low pressure CVD (chemical vapor deposition) apparatuses, and rapid thermal processors (RTPs). The controller calculates the oxide film thickness based on the gas flow rate and temperature obtained from the manufacturing apparatus and discontinues the process in the manufacturing apparatus when a desired film thickness is achieved.

On the other hand, the Japanese Laid-Open Patent Publication No. 2006-190795 discloses a method wherein the dimension of a gate electrode formed on a wafer is measured and the electric property of the semiconductor device over the waver is estimated based on the relationship between the gate length and electric property (gate threshold voltage, source-drain current, and the like). The processing temperature profile over the wafer surface is calculated based on the difference from the designed value and the relationship between temperature and electric property and compared with control data (temperature profile) of the manufacturing apparatus. Then, the temperature profile within the manufacturing apparatus is corrected to minimize variation in the electric property over the waver surface.

SUMMARY OF THE INVENTION

However, the above described prior art has several problems. First, the method disclosed in the Japanese Laid-Open Patent Publication No. 2007-59945 estimates the oxide film thickness on a wafer using the partial gas pressure obtained from the gas flow rate and the temperature in the semiconductor device manufacturing apparatus. Changes in the apparatus condition are unlikely to be known using only these parameters. This can easily be explained by the oxide film forming mechanism, principle of measuring apparatus parameters, and nature of the apparatus parameters.

More specifically, oxygen atoms (or oxygen radicals) present on the wafer surface acquire thermal energy and bind to silicon, forming an oxide film. The number of oxygen atoms can be known from the partial gas pressure. Precise thermal energy cannot be known from the wafer temperature that the manufacturing apparatus reads.

The wafer temperature is measured in the manufacturing apparatus using a thermo couple or a pyrometer (radiation thermometer). In the former case, a thermo couple is inserted in a protection tube and the tip of the tube is brought into contact with the wafer to measure the temperature. The obtained temperate is the wafer temperature when the heat is in an equilibrium state and the temperature of the protection tube for the thermo couple when the heat is in a nonequilibrium state such as in RTP. Therefore, the precise wafer temperature is not known.

On the other hand, the latter, pyrometer, performs better than the thermo couple in measuring the wafer temperature. However, the pyrometer does not precisely measure the wafer temperature itself, either. The pyrometer converts incident heat emission to temperature. The pyrometer is calibrated with a blackbody furnace. Then, the measured value is assumed to be of a black measuring object as it is. Thus, the wafer emissivity is obtained and the measured value is converted to the wafer temperature based on the emissivity. The heat emission entering the pyrometer includes heat emission from some sources other than the wafer. Then, the heat emission from some sources other than wafer should be subtracted for correction. The wafer temperature obtained in this way should need some adjustment. The adjustment amount depends on the manufacturing apparatus condition. For example, the wafer emissivity measured by the manufacturing apparatus is not always the same because of changes in the apparatus condition even if wafers have the same true wafer emissivity.

Thus, there is a difference between the measured wafer temperature and the actual wafer temperature in the manufacturing apparatus according to the apparatus condition. The manufacturing apparatus tries to control the measured wafer temperature for a fixed temperature, changing the heat source output power. In other words, changes in the apparatus condition emerge as changes in the heat source output power, not as the wafer temperature. Then, the oxide film thickness has to be estimated in consideration of the heat source output power.

The method disclosed in the Japanese Laid-Open Patent Publication No. 2006-190795 utilizes the temperature obtained by adjusting the actual wafer temperature profile with manufacturing apparatus control data, or the sheet resistance after the impurity activation process. The control data are periodically measured. For example, when the control data are measured weekly, changes in the apparatus condition cannot be fed back to the wafer outcome (the impurity concentration uniformity in this case). When the measuring cycle is shortened, the measuring time significantly reduces the manufacturing apparatus throughput. Furthermore, when very small semiconductor devices are manufactured, an APC for each lot or each wafer is necessary. It is impractical in cost to measure the sheet resistance by lot or by wafer and feed it back.

Then, the purpose of the present invention is to provide a semiconductor device manufacturing method to precisely catch changes in the manufacturing apparatus condition and feed back the changes in each lot or wafer processing, thereby reducing variations in the film thickness or impurity concentration over the wafer surface.

In order to accomplish the objective, the present invention has adopted technical means mentioned below. At first, the present invention is premised upon a semiconductor device manufacturing method including a step of thermally processing a wafer placed in a chamber. In the semiconductor device manufacturing method of the present invention, the thermal process is conducted as follows.

First, an emissivity of a wafer placed in the chamber is measured. Then, a fluctuation rate of a wafer physical quantity that fluctuates in association with a given thermal energy quantity is calculated based on an estimate expression, which are obtained in advance, presenting a relationship between a thermal energy quantity emitted from a heat source for heating the wafer, wafer emissivity and the wafer physical quantity fluctuation rate and on the measured emissivity. Then, a processing time for the physical quantity to be a specific value is calculated based on the calculated fluctuation rate. Then, the thermal process is conducted for the calculated processing time.

For example, when the thermal process is a process to form an oxide film on a wafer surface, the wafer physical quantity that fluctuates in association with the given thermal energy quantity may be an oxide film thickness. Alternatively, when the thermal process is a process to activate an impurity region, the wafer physical quantity that fluctuates in association with the given thermal energy quantity may be the sheet resistance of the impurity region (impurity concentration distribution).

According to the above semiconductor device manufacturing method, even if the manufacturing apparatus condition is subject to some change, the film thickness or impurity concentration distribution can be controlled for a desired condition according to the change.

In another semiconductor device manufacturing method of the present invention, fit, an emissivity of a wafer placed in the chamber is measured. Then, a fluctuation rate of a wafer physical quantity that fluctuates in association with a given thermal energy quantity is calculated based on an estimate expression, which are obtained in advance, presenting a relationship between a thermal energy quantity emitted from a heat source for heating the wafer, wafer emissivity and the wafer physical quantity fluctuation rate and on the measured emissivity. Subsequently, the wafer physical quantity at the end of a planned processing time is calculated based on the calculated physical quantity fluctuation rate and the planned processing time. Then, it is determined whether or not the calculated physical quantity falls within a predetermined range. When the calculated physical quantity falls within the predetermined range, the thermal process is conducted.

According to this semiconductor device manufacturing method, when the manufacturing apparatus condition is subject to some change and the film thickness or impurity concentration distribution is not controlled for a desired condition, the thermal process can be discontinued. Consequently, reduction in the production yield can be prevented in advance.

In the above structure, the physical quantity may be calculated for several points on a wafer. Then, when the uniformity of the calculated physical quantities over the wafer surface falls outside a predetermined range, the thermal process is discontinued or the output power of one or more heat sources is controlled so that the film thickness uniformity over the wafer surface is controlled for the predetermined range.

The estimate expression may include the wafer emissivity that depends on a product type of the wafer.

The estimate expression may include a virtual thermal energy loss as a parameter.

When the thermal process is conducted in a lamp heating thermal processing apparatus, the thermal energy loss may be calculated based on the reflectance (or emissivity) of a reflecting plate placed under the wafer that is changed by a film adhered to the reflecting plate.

When the thermal process is conducted in a lamp heating thermal processing apparatus, the thermal energy loss may be calculated based on the pressure in the lamp chamber.

When the calculated physical quantity is found to fall outside the range, the film adhered to the reflecting plate may be removed by running an etching gas in the absence of a wafer.

When the manufacturing apparatus condition is subject to some change in the course of use, the semiconductor device manufacturing method of the present invention can control the film thickness or impurity concentration distribution (sheet resistance) for a desired value according to the change, reducing variations in the wafer properties and controlling the morphology of the semiconductor device. Consequently, the production yield of the semiconductor device can be improved.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Embodiments of the present invention are described in detail hereafter, with reference to the drawings. In the following embodiments, the present invention is realized in a process to form an oxide film on a wafer.

First Embodiment

Figure 1:
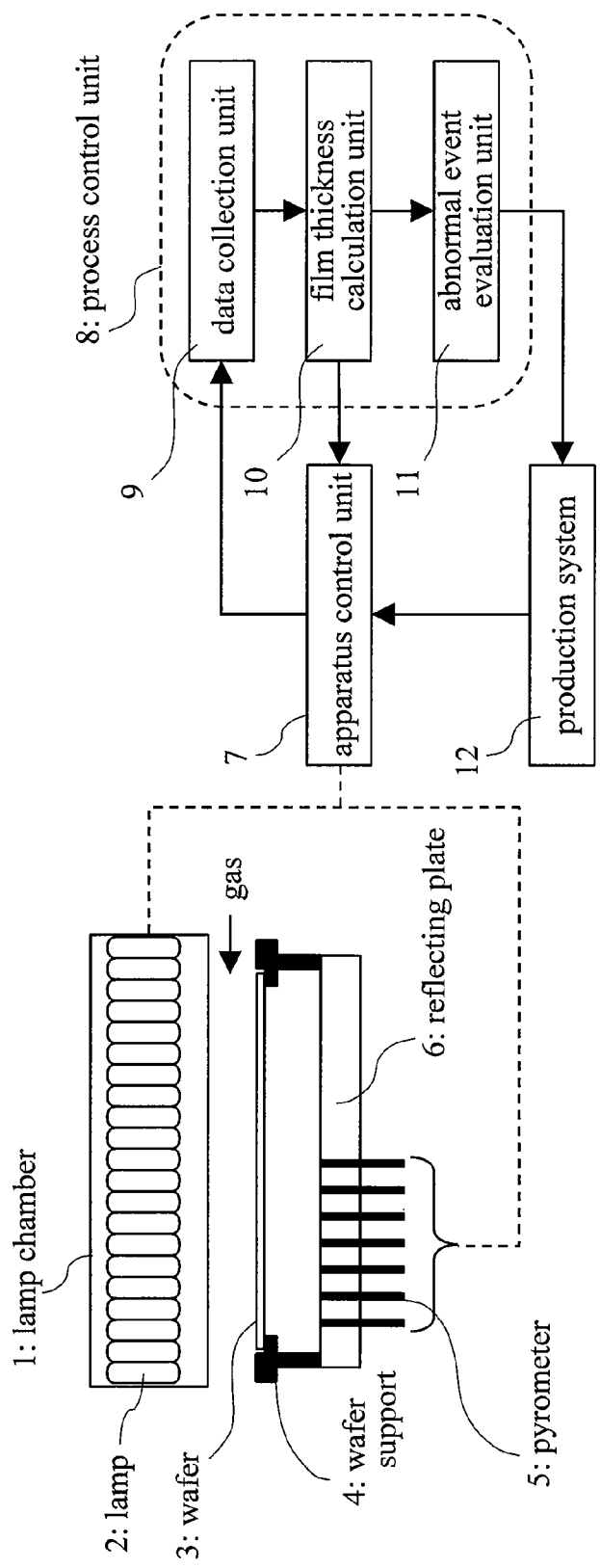
FIG. 1 is an illustration showing a structure of a thermal processing apparatus for manufacturing semiconductor devices in the first embodiment according to the present invention.

A first embodiment according to the present invention is described with reference to FIGS. 1 to 4. FIG. 1 is a schematic illustration showing the structure of a thermal processing apparatus for forming films such as oxide films, the thermal processing apparatus is a semiconductor device manufacturing apparatus in this embodiment.

As shown in FIG. 1, the thermal processing apparatus comprises a lamp chamber 1 in which multiple lamps 2 are provided as a heat source. Facing the lamp chamber 1 is a wafer support 4 that supports a wafer 3. Pyrometers 5 measuring the temperature of the wafer 3 and a reflecting plate 6 reflecting heat emission from the wafer 3 are provided on the back side of the wafer 3 supported by the wafer support 4. The wafer support 4, pyrometers 5, and reflecting plate 6 are placed in a vacuumable chamber.

The thermal processing apparatus further comprises an apparatus control unit 7 controlling the output power of the lamps 2, gas, pressure, and processing time based on the temperature measured by the pyrometers 5 and a process control unit 8. The process control unit 8 comprises a data collection unit 9 collecting and storing data, a film thickness calculation unit 10 estimating the oxide film thickness based on the collected data, and an abnormal event evaluation unit 11 evaluating as to whether the calculated film thickness falls within a predetermined reference film thickness range. Abnormal event information found by the abnormal event evaluation unit 11 is sent to a production system 12.

For example, the apparatus control unit 7, data collection unit 9, film thickness calculation unit 10, and abnormal event evaluation unit 11 can be realized by an exclusive-use calculation circuit, or hardware having a processor and memories such as RAM (random access memory) or ROM (read only memory), etc. and software stored in the memories and operating on the processor. The data collection unit 9 further comprises a memory device such as HDD (hard disk drive) storing the collected data.

With the above structure, the lamps 2 heat the wafer 3 with a gas introduced in the chamber and controlled for a fixed pressure. Meanwhile, the pyrometers 5 measure the heat emission from the wafer 3 and calculate the wafer temperature based on the Planck's law in consideration of the wafer emissivity. The apparatus control unit 7 controls the output power of the lamps 2 for a constant wafer temperature. The lamps 2 are divided into multiple zones (for example 15 zones). The lamp output power is controlled by zone for a uniform wafer surface temperature.

Generally, there are two types of thermal processing apparatuses measuring the wafer temperature using pyrometers: one type directly obtains the wafer emissivity and the other type indirectly obtains (calculates) it using other parameters. The thermal processing apparatus in FIG. 1 is of the latter type.

Herein, how the thermal processing apparatus shown in FIG. 1 obtains the wafer emissivity is briefly described hereafter.

In FIG. 1, heat emitted from the wafer 3 to the reflecting plate 6 is reflected by the reflecting plate 6 and again partly reflected by the wafer 3. Such reflection is repeated and accumulated heat emission is taken in by the pyrometers 5. On the other hand, another pyrometer taking in only the heat emission from the wafer 3 is provided to measure the temperature (see FIG. 2A).

Figure 2A:
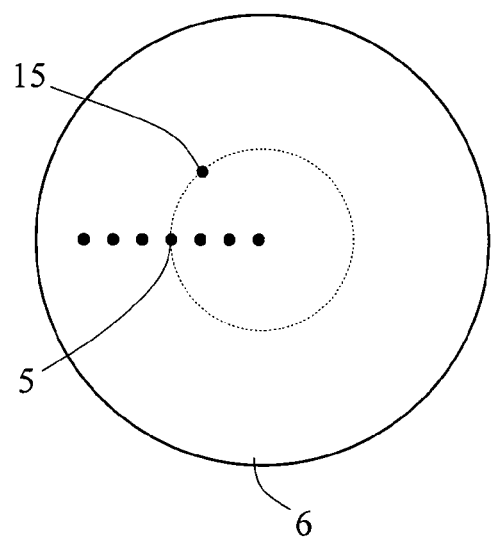
FIGS. 2A to 2C are illustrations showing the positions of pyrometers in the thermal processing apparatus in the first embodiment according to the present invention.

FIG. 2A is a plane view showing the positions of the pyrometers on the surface of the reflecting plate 6 in the thermal processing apparatus shown in FIG. 1. As shown in FIG. 2A, the reflecting plate 6 carries multiple pyrometers 5 (seven in this case) at proper intervals (equal intervals in this case) in a radial direction of the wafer 3. The pyrometers 5 each measure heat emitted from the underside of the wafer 3 from the center to the outer periphery.

On the other hand, a pyrometer 15 taking in only the heat emission from the wafer 3 is provided at a different position from the pyrometers 5. In this example, the pyrometer 15 is on the same circle as the middle (fourth) pyrometer 5 among the radially arranged ones, but in a different radial direction.

Figure 2B:
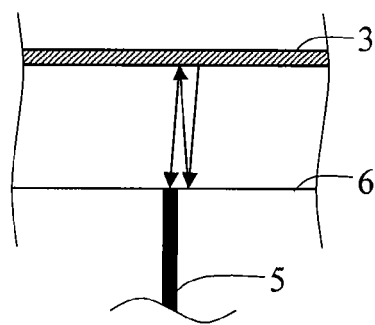
Figure 2C:
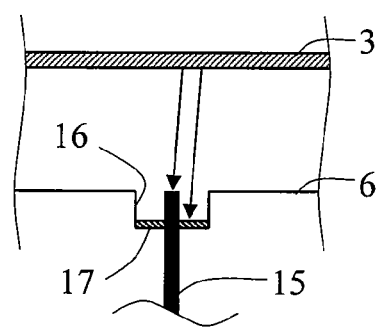

The pyrometers 5 and 15 do not have any difference in structure. However, they are surrounded by the reflecting plate 6 differently. FIGS. 2B and 2C are cross-sectional views showing the surrounding structures of the pyrometers 5 and 15, respectively. The pyrometers 5 are each placed in a through-hole formed in the reflecting plate 6 with the tip nearly flush with the surface of the reflecting plate 6. The pyrometer 15 is also placed in the same manner except that it is surrounded by a recess 16 formed in the surface portion of the reflecting plate 6 over a specific distance. The recess 16 has on the bottom an absorber 17 reducing reflection of light (heat emission) of wavelengths measured by the pyrometer 15. Therefore, the heat is less reflected around the pyrometer 15 and only the heat emission from the wafer 3 enters the tip of the pyrometer 15.

The pyrometers 5 and pyrometer 15 read different temperatures. In this embodiment, the wafer emissivity is determined by using an experimental equation in which the temperature difference and the wafer emissivity of the wafer 3 have a relationship of a linear function.

However, as the wafer thermal process is repeated, a film is formed on the surface of the reflecting plate 6 because of outgassing from the wafer and the process gas turning around to the underside of the wafer, deteriorating the reflecting performance or reducing the reflectance. Because of the reflecting plate 6 having a reduced reflectance, the wafer emissivity calculated in the thermal processing apparatus in FIG. 1 is different from the actual wafer emissivity of the wafer 3. Then, some error occurs in the wafer temperature and, consequently, a desired film thickness cannot be obtained.

The lamp chamber 1 is filled with an inert gas. The gas absorbs part of heat from the lamps 2, changing the pressure within the lamp chamber 1. With the pressure being changed, the inert gas absorbs an altered amount of heat from the lamps 2, thus changing the mount of heat reaching the wafer.

The expression for estimating the oxide film thickness formed on a wafer in consideration of the above thermal energy loss is described hereafter. It is assumed that Ri is the oxide film rate (film formation rate) at a position i on the wafer surface and Ri is proportional to the oxygen radical concentration and thermal energy over the wafer. The oxygen radical concentration is proportional to the chamber pressure provided that the gas is introduced at a fixed rate. The thermal energy is calculated by subtracting thermal energy absorbed by the reflecting plate 6 from thermal energy generated by heat emission energy output from the lamps 2 except for absorbed in the lamp chamber 1. Then, the following expression (1) is given.

Ri ∝ oxygen radical concentration × thermal energy $$= P \cdot \left\{ \left( \sum_j A_{ij} \cdot L_j - B_i \cdot L_T \cdot P_L \right) \varepsilon_W - C_i \cdot L_T \cdot \frac{1 - (1 - \varepsilon_M / D_i)}{1 - \varepsilon_M} \right\} \quad (1)$$

in which P is the chamber pressure, $L_j$ is the lamp output power in each zone (j is the zone number), $P_L$ is the lamp chamber pressure, $L_T$ is the total lamp output power in all zones (or the average), and $\varepsilon_M$ is the wafer emissivity calculated in the thermal processing apparatus. These parameter values are obtained from the thermal processing apparatus and collected by the data collection unit 9. $A_{ij}$, $B_i$, $C_i$, and $D_i$ are constants determined for each position i (here the positions corresponding to each pyrometer 5) and $\varepsilon_w$ is a common constant regardless of the position i. These parameters are obtained for example by multiple linear regression analysis against obtained data by experiment in advance. The physical meaning of $\varepsilon_w$ is a true wafer emissivity. With the wafer emissivity being replaced (obtained) for each product type, the oxide film rate on a wafer having a different pattern rate can be expressed by the same expression (1).

The oxide film thickness is given by the product of the oxide film rate calculated by the expression (1) and the processing time.

Figure 3A:
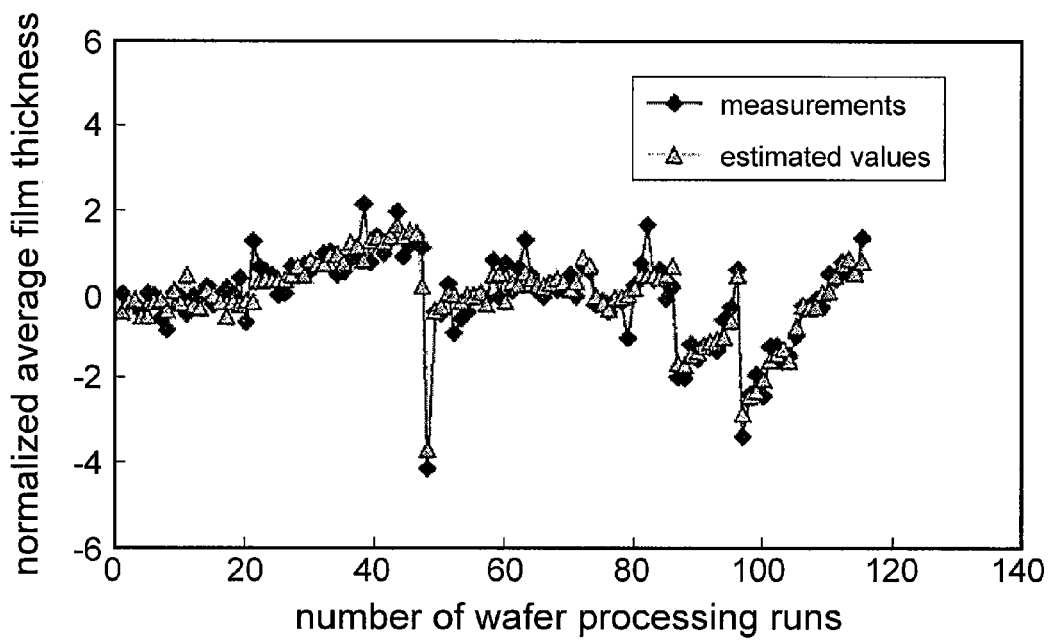
FIGS. 3A and 3B are graphical representations comparatively showing estimated values and actual measurements of an average oxide film thickness and oxide film thickness uniformity in the thermal processing apparatus in the first embodiment according to the present invention, respectively.
Figure 3B:
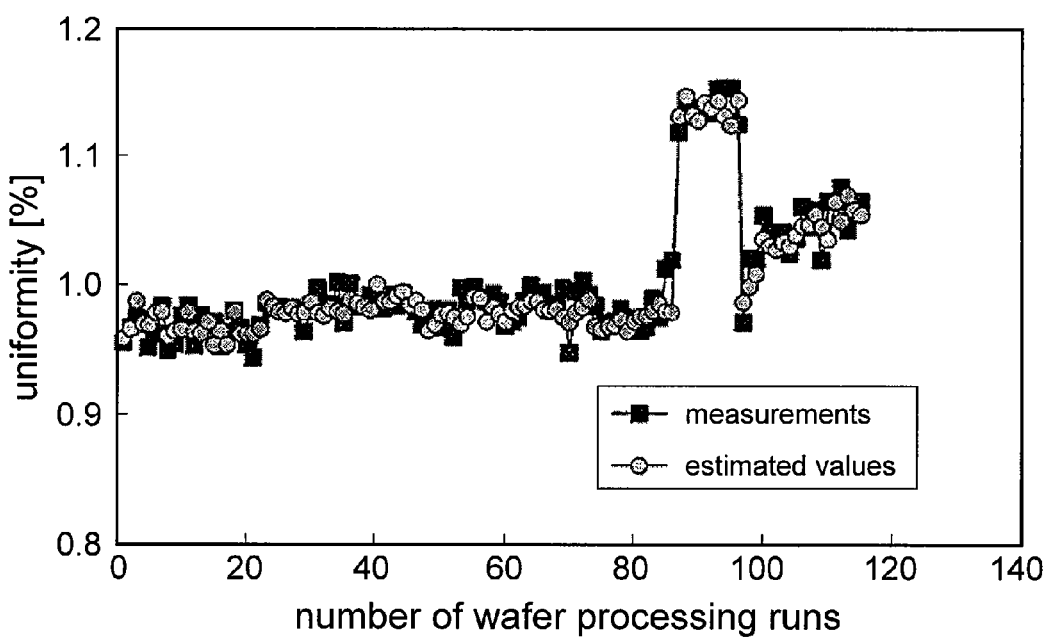

FIGS. 3A and 3B comparatively show actual measurements and estimated values obtained by the expression (1) of the average oxide film thickness and the oxide film thickness uniformity over the wafer surface, respectively. FIG. 3A shows comparison in the average oxide film thickness. FIG. 3B shows comparison in the oxide film thickness uniformity over the surface. In FIGS. 3A and 3B, the horizontal axis corresponds to the number of wafer processing runs. The vertical axis in FIG. 3A corresponds to the average film thickness and the vertical axis in FIG. 3B corresponds to the uniformity over the surface. The average film thickness in FIG. 3A is expressed as differences from a specific reference value. The uniformity over the surface in FIG. 3B is calculated as follows: (largest film thickness−smallest film thickness)/average film thickness.

Figure 4:
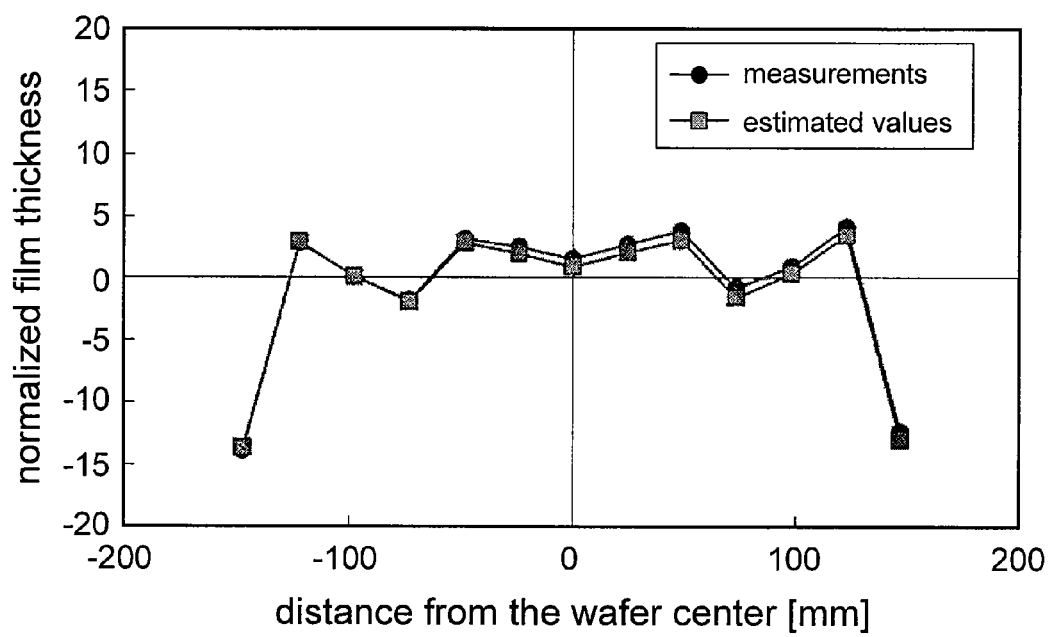
FIG. 4 is a graphical representation comparatively showing estimated values and actual measurements of an oxide film thickness profile over a wafer surface in the thermal processing apparatus in the first embodiment according to the present invention.

Furthermore, FIG. 4 comparatively shows actual measurements and estimated values obtained by the expression (1) of the oxide film thickness profile over the wafer surface. In FIG. 4, the horizontal axis corresponds to the distance from the wafer center and the vertical axis corresponds to the oxide film thickness. The film thickness in FIG. 4 is also expressed as differences from a specific reference value.

In FIGS. 3 and 4, the estimated values and actual measurements match each other with high accuracy. Therefore, an oxide film of a desired thickness can be formed on the wafer 3 by conducting the thermal process for a processing time calculated by dividing the target film thickness by the oxide film rate calculated by the expression (1).

Figure 5:
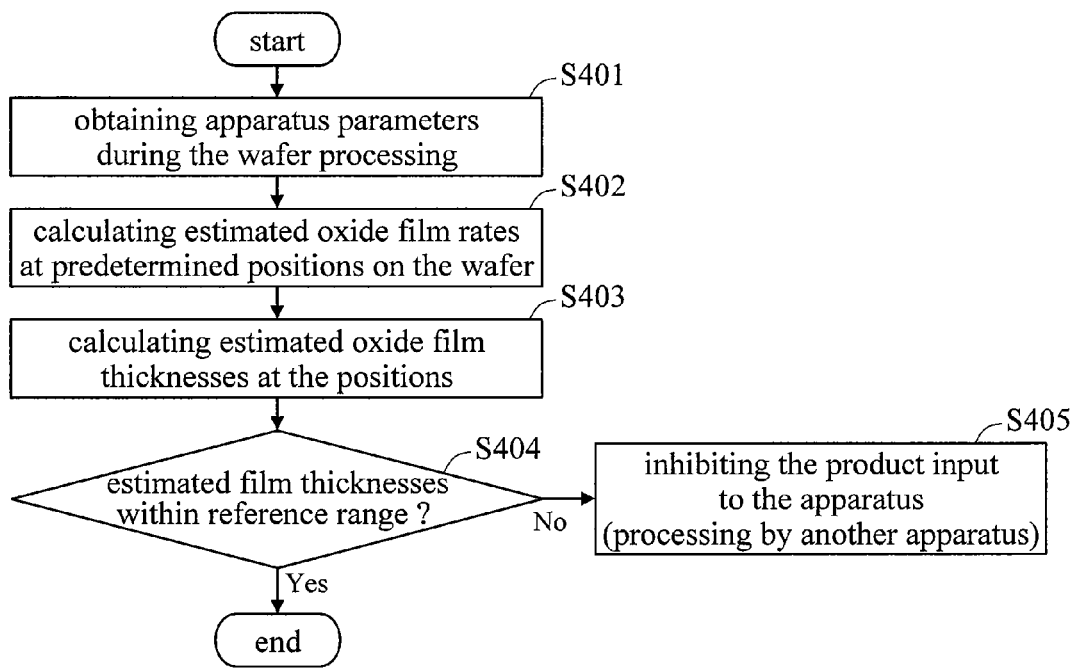
FIG. 5 is a flowchart for evaluating as to any abnormal estimated film thickness in a process control unit of the thermal processing apparatus in the first embodiment according to the present invention.

Using the estimated oxide film rate calculated by the expression (1) prevents reduction in the production yield in advance. FIG. 5 shows a flowchart for discontinuing the process when the estimated film thickness obtained based on the estimated oxide film rate falls outside the reference range. First, in the thermal processing apparatus shown in FIG. 1, the above described parameters (P, $L_j$, $P_L$, $L_T$, $\varepsilon_M$) during the wafer processing are obtained from the data collection unit 9 (S401). Then, the film thickness calculation unit 10 calculates estimated oxide film rates at multiple predetermined positions (which are equal to the positions where the film thickness is measured) on the wafer by the expression (1) using the obtained parameters (S402). The obtained oxide film rates are multiplied by the planned processing time to obtain the estimated oxide film thicknesses at the positions on the wafer (S403). The abnormal event evaluation unit 11 evaluates as to whether or not the estimated film thicknesses at the positions on the wafer fall within the reference range (a predetermined range) (S404). When any estimated film thickness falls outside the reference range, the abnormal event evaluation unit 11 sends the production system 12 information to inhibit the product input (S405).

As described above, in this embodiment, even if the apparatus condition is subject to some change, the film thickness can be controlled for a desired condition according to the change. The oxide film thicknesses over the wafer surface are estimated based on the thermal processing apparatus parameter data in each wafer processing, preventing reduction in the production yield of products.

This embodiment is described with regard to the oxide film thickness by means of example. The present invention is applicable to other film formation, silicide formation, and impurity diffusion in a similar apparatus structure. This is true for the following embodiments.

For a thermal process under normal pressure such as impurity diffusion, the pressure in the lamp chamber is not controlled. Then, the lamp chamber pressure $P_L$ can be ignored in the expression (1). In such a case, the expression (1) is rewritten as follows:

$$R_i = P \cdot \left\{ \left( \sum_j A_{ij} \cdot L_j \right) \varepsilon_W - C_i \cdot L_T \cdot \frac{1 - (1 - \varepsilon_M / D_i)}{1 - \varepsilon_M} \right\} \quad (2)$$

For example, when the thermal process is a process to activate an impurity region, Ri in the left-hand side of the expression (2) is the sheet resistance fluctuation rate at a position i.

Second Embodiment

Figure 6:
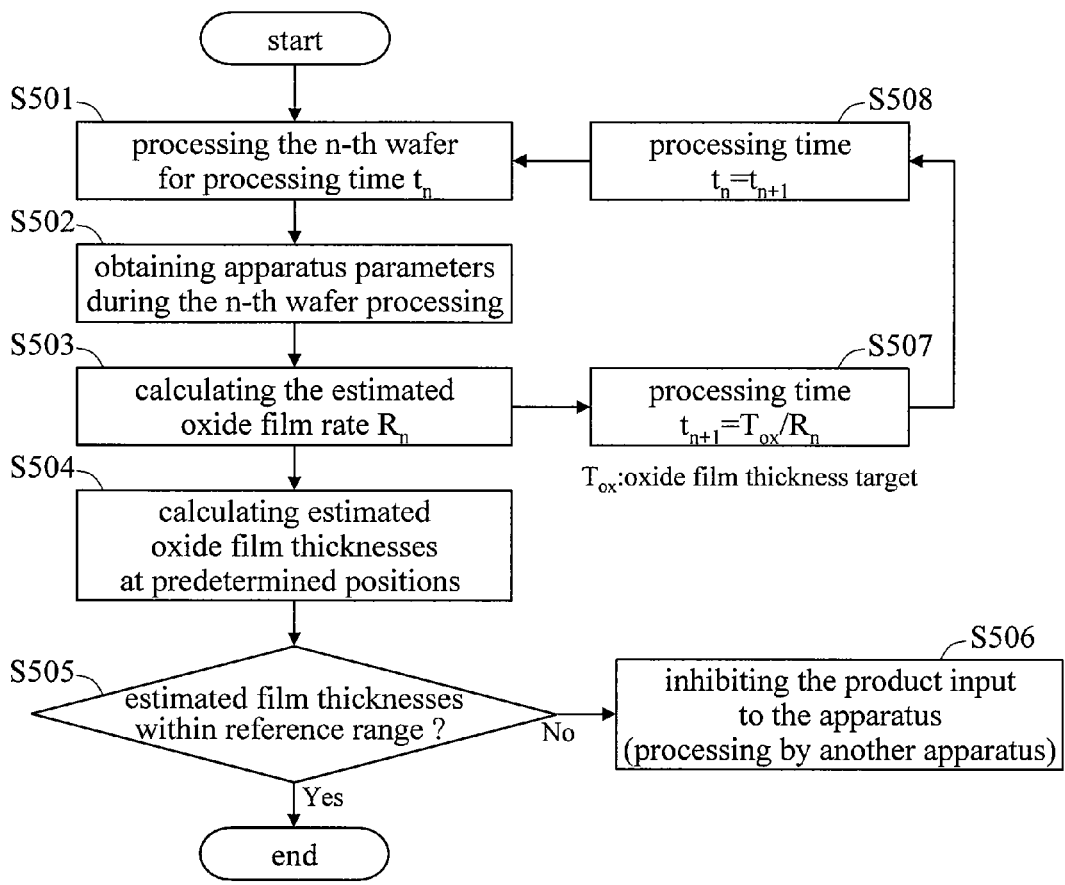
FIG. 6 is a flowchart for controlling an oxide film thickness using estimated oxide film rates in a thermal processing apparatus in the second embodiment according to the present invention.
Figure 7:
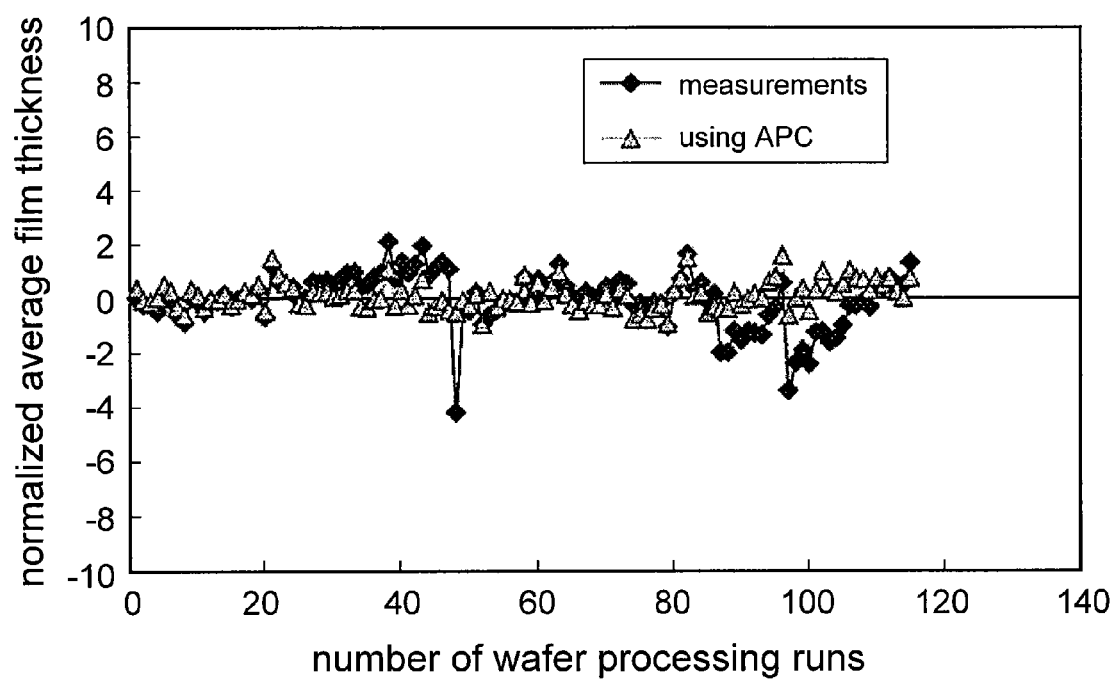
FIG. 7 is a graphical representation comparatively showing estimated values and actual measurements when the oxide film thickness is controlled in the thermal processing apparatus in the second embodiment according to present invention.

A second embodiment of the present invention is described hereafter with reference to FIGS. 1, 6, and 7. The manufacturing apparatus has the overall same structure as in the first embodiment. The same reference numbers are used and their explanation is omitted.

FIG. 6 shows a flowchart for controlling the oxide film thickness using an estimated oxide film rate. It is assumed that the n-th wafer is processed for a time $t_n$ in the thermal processing apparatus shown in FIG. 1 (S501). The data collection unit 9 obtains the above described thermal processing apparatus parameters during the process (S502). Then, the film thickness calculation unit 10 calculates estimated oxide film rates at multiple positions over the wafer surface based on the parameters obtained by the data collection unit 9 and the expression (1) and calculates the average value $R_n$ (S503). In addition, the film thickness calculation unit 10 calculates the next wafer processing time $t_{n+1}$ based on the average value $R_n$ and an oxide film thickness target $T_{OX}$ (S507). Furthermore, the film thickness calculation unit 10 calculates estimated oxide film thicknesses at the positions based on the estimated oxide film rates at the positions and the next wafer processing time $t_{n+1}$ (S504). The abnormal event evaluation unit 11 evaluates as to whether the estimated film thicknesses fall within the reference value range (S505). When any estimated film thickness falls outside the reference value range, the abnormal event evaluation unit 11 sends the production system 12 information to inhibit the input of the next product into the apparatus (S506). When the estimated film thicknesses fall within the reference value range, the process flow for processing the next wafer (FIG. 6) starts. In the process flow for processing the next wafer, $t_n$ is replaced with the wafer processing time $t_{n+1}$ (S508).

FIG. 7 comparatively shows estimated values and actual measurements of the oxide film thickness controlled by the above method. In FIG. 7, the horizontal axis corresponds to the number of wafer processing runs and the vertical axis corresponds to the average film thickness. FIG. 7 shows that the oxide film is controlled by this technique with accuracy.

As described above, in this embodiment, the oxide film thickness on the next wafer can be controlled based on the thermal processing apparatus parameter data in each wafer processing, preventing reduction in production variation and producing products at high yields.

Third Embodiment

Figure 8:
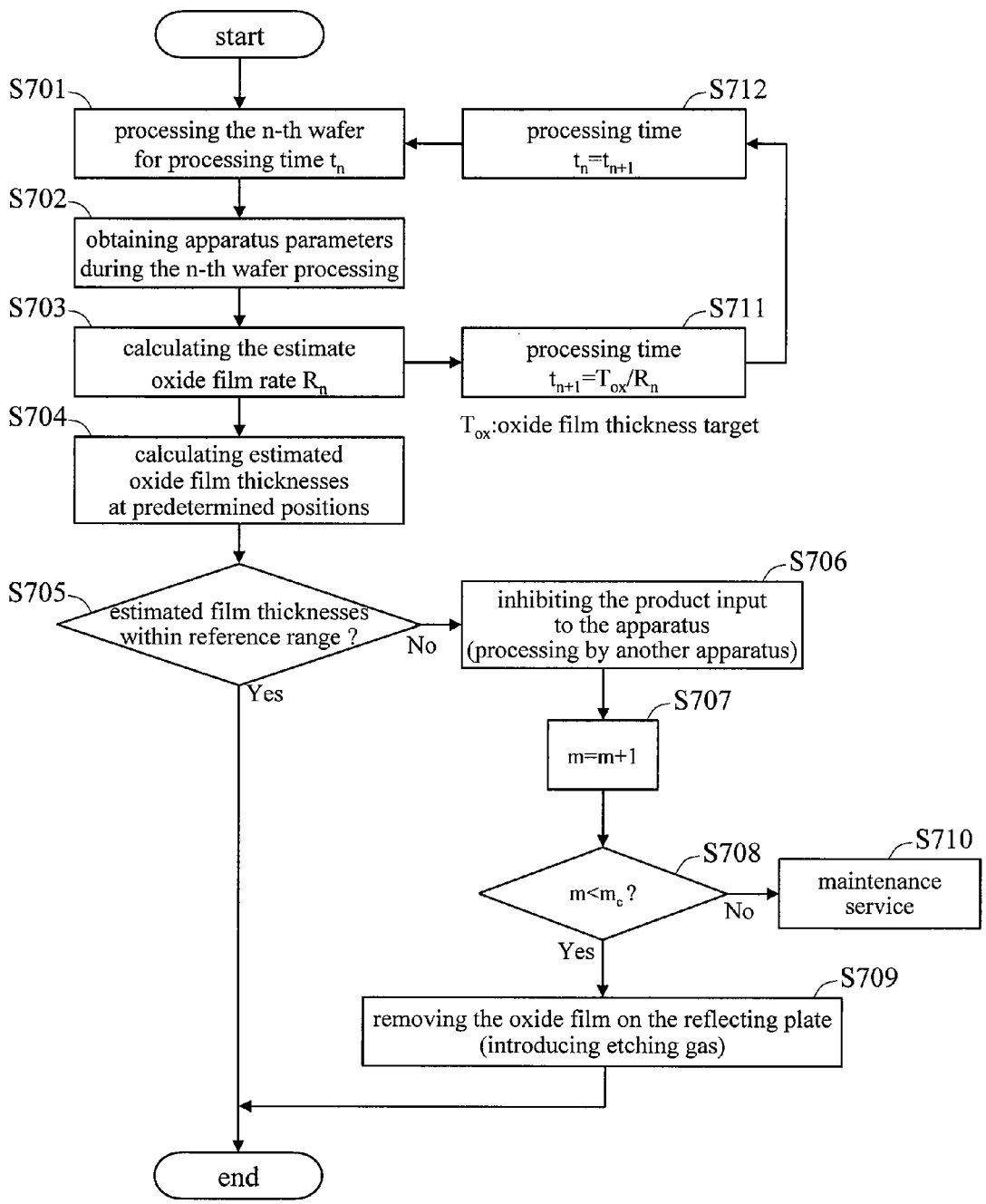
FIG. 8 is a flowchart having a step of removing an oxide film on a reflecting plate in addition to an oxide film thickness control in a thermal processing apparatus in the third embodiment according to of the present invention.
Figure 9:
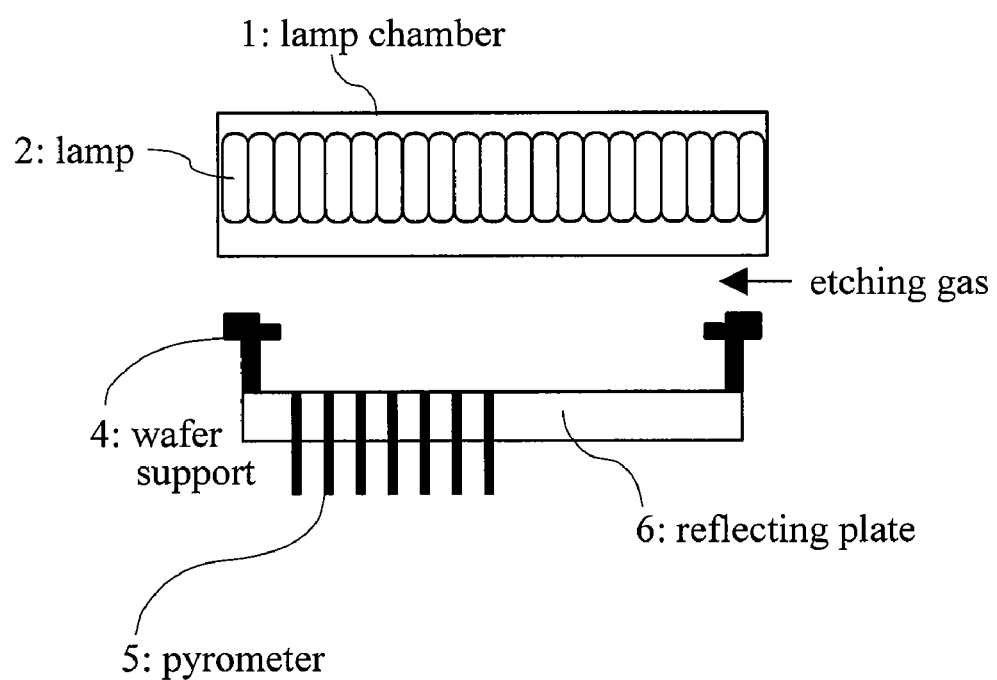
FIG. 9 is an illustration showing an etching gas introduction for removing an oxide film on a reflecting plate in a thermal processing apparatus in the third embodiment according to the present invention.

A third embodiment 3 of the present invention is described hereafter with reference to FIGS. 8 and 9. The manufacture apparatus has the same overall structure as in the first embodiment. The same reference numbers are used and their explanation is omitted.

FIG. 8 shows the flowchart for controlling the oxide film in the second embodiment with the additional flowchart of a step of removing the oxide film on the reflecting plate 6. The n-th wafer is processed for a time $t_n$ in the thermal processing apparatus shown in FIG. 1 (S701), and the data collection unit 9 obtains the above described thermal processing apparatus parameters during the process (S702). Then, the film thickness calculation unit 10 calculates estimated oxide film rates at multiple positions over the wafer surface using the parameters obtained by the data collection unit 9 and the expression (1) and calculates the average value Rn (S703). In addition, the film thickness calculation unit 10 calculates the next wafer processing time $t_{n+1}$ based on the average value $R_n$ and an oxide film thickness target $T_{OX}$ (S711). Furthermore, the film thickness calculation unit 10 calculates estimated oxide film thicknesses at the positions based on the estimated oxide film rates at the positions and the next wafer processing time $t_{n+1}$ (S704). The abnormal event evaluation unit 11 evaluates as to whether or nor the estimated film thicknesses fall within the reference value range (S705). When any estimated film thickness falls outside the reference value range, the abnormal event evaluation unit 11 sends the production system 12 information to inhibit the input of the next product into the apparatus (S706).

Then, the abnormal event evaluation unit 11 increases its own counter m by 1 (S707) and compares m with a predetermined reference number $m_c$ (S708). When the counter value m is smaller than the reference number $m_c$, an etching gas is introduced in the chamber in the absence of a wafer to remove the oxide film adhered to the reflecting plate 6 (S709). When the counter value m reaches the reference number $m_c$, the apparatus maintenance service including cleaning of the pyrometer tips and replacement of the reflecting plate 6 and wafer support 4 is provided (S710). After the apparatus maintenance service is provided, the counter value is reset. On the other hand, when the estimated film thicknesses fall within the reference value range, the process flow for processing the next wafer (FIG. 8) starts as in the second embodiment. In the process flow for processing the next wafer, $t_n$ is replaced with the wafer processing time $t_{n+1}$ (S712)

When the oxide film thicknesses at all positions over the wafer surface fall outside the reference value range (when the uniformity deteriorates), the reflecting film 6 presumably has an oxide film formed as described above. Then, an etching gas is introduced to remove the film and eliminate a factor of the oxide film thickness fluctuation. And, how many times the etching gas is introduced are determined in advance and the maintenance service is provided to the thermal processing apparatus when the number is reached.

FIG. 9 shows how an etching gas is introduced in the chamber. An etching gas is introduced into the chamber in the absence of a wafer to remove the oxide film on the reflecting plate 6.

As described above, in this embodiment, the apparatus is not subject to a long idle time due to apparatus maintenance service when the oxide film thickness uniformity over the wafer surface deteriorates, improving the apparatus operation rate.

The semiconductor device manufacturing method of the present invention is a useful manufacturing technique to control the oxide film thickness or impurity concentration over the wafer surface with accuracy, reduce production variation, and improve production yield.

While the invention has been described in detail, the foregoing description is in all aspects illustrative and not restrictive. It is understood that numerous other modifications and variations can be devised without departing from the scope of the invention.

What is claimed is:

1. A semiconductor device manufacturing method including a step of thermally processing a wafer placed in a chamber, the thermal process comprising the steps of:
   measuring an emissivity of a wafer placed in the chamber;
   calculating a fluctuation rate of a wafer physical quantity that fluctuates in association with a given thermal energy quantity based on an estimate expression, which are obtained in advance, presenting a relationship between a thermal energy quantity emitted from a heat source for heating the wafer placed in the chamber, wafer emissivity and the wafer physical quantity fluctuation rate and on the measured emissivity;
   calculating a processing time for the physical quantity to be a specific value based on the calculated fluctuation rate; and conducting the thermal process for the calculated processing time,
wherein the estimate expression includes a virtual thermal energy loss, the thermal process is conducted in a lamp heating thermal processing apparatus and the thermal energy loss is calculated based on a pressure in the lamp chamber.

2. A semiconductor device manufacturing method including a step of thermally processing a wafer placed in a chamber, the thermal process comprising the steps of:
measuring an emissivity of a wafer placed in the chamber;
calculating a fluctuation rate of a wafer physical quantity that fluctuates in association with a given thermal energy quantity based on an estimate expression, which are obtained in advance, presenting a relationship between a thermal energy quantity emitted from a heat source for heating the wafer placed in the chamber, wafer emissivity and the wafer physical quantity fluctuation rate and on the measured emissivity;
calculating the wafer physical quantity after a planned processing time based on the estimated physical quantity fluctuation rate and the planned processing time;
evaluation as to whether or not the calculated physical quantity falls within a predetermined range; and
conducting the thermal process when the calculated physical quantity falls within the predetermined range,
wherein the estimate expression includes a virtual thermal energy loss, the thermal process is conducted in a lamp heating thermal processing apparatus and the thermal energy loss is calculated based on a pressure in the lamp chamber.

3. A semiconductor device manufacturing method according to claim 1, wherein the physical quantity is calculated for several points on the wafer and the thermal process is discontinued when the uniformity of the calculated physical quantities over the wafer surface falls outside a predetermined range.

4. A semiconductor device manufacturing method according to claim 2, wherein the physical quantity is calculated for several points on the wafer and the thermal process is discontinued when the uniformity of the calculated physical quantities over the wafer surface falls outside a predetermined range.

5. A semiconductor device manufacturing method according to claim 1, wherein the estimate expression includes the wafer emissivity that depends on a product type of the wafer.

6. A semiconductor device manufacturing method according to claim 2, wherein the estimate expression includes the wafer emissivity that depends on a product type of the wafer.

7. A semiconductor device manufacturing method including a step of thermally processing a wafer placed in a chamber, the thermal process comprising steps of:
measuring an emissivity of a wafer placed in the chamber;
calculating a fluctuation rate of a wafer physical quantity that fluctuates in association with a given thermal energy quantity based on an estimate expression, which are obtained in advance, presenting a relationship between a thermal energy quantity emitted from a heat source for heating the wafer placed in the chamber, wafer emissivity and the wafer physical quantity fluctuation rate and on the measured emissivity;
calculating a processing time for the physical quantity to be a specific value based on the calculated fluctuation rate; and
conducting the thermal process for the calculated processing time,
wherein the estimate expression includes a virtual thermal energy loss, the thermal process is conducted in a lamp heating thermal processing apparatus and the thermal energy loss is calculated based on a reflectance or emissivity of a reflecting plate placed under the wafer that is changed by a film adhered to the reflecting plate.

8. A semiconductor device manufacturing method including a step of thermally processing a wafer placed in a chamber, the thermal process comprising steps of:
measuring an emissivity of a wafer placed in the chamber;
calculating a fluctuation rate of a wafer physical quantity that fluctuates in association with a given thermal energy quantity based on an estimate expression, which are obtained in advance, presenting a relationship between a thermal energy quantity emitted from a heat source for heating the wafer placed in the chamber, wafer emissivity and the wafer physical quantity fluctuation rate and on the measured emissivity;
calculating the wafer physical quantity after a planned processing time based on the estimated physical quantity fluctuation rate and the planned processing time;
evaluating as to whether or not the calculated physical quantity falls within a predetermined range; and
conducting the thermal process when the calculated physical quantity falls within the predetermined range,
wherein the estimate expression includes a virtual thermal energy loss, the thermal process is conducted in a lamp heating thermal processing apparatus and the thermal energy loss is calculated based on a reflectance or emissivity of a reflecting plate placed under the wafer that is changed by a film adhered to the reflecting plate.

9. A semiconductor device manufacturing method according to claim 7, wherein the physical quantity is calculated for several points on the wafer and the thermal process is discontinued when the uniformity of the calculated physical quantities over the wafer surface falls outside a predetermined range.

10. A semiconductor device manufacturing method according to claim 8, wherein the physical quantity is calculated for several points on the wafer and the thermal process is discontinued when the uniformity of the calculated physical quantities over the wafer surface falls outside a predetermined range.

11. A semiconductor device manufacturing method according to claim 7, wherein the estimate expression includes the wafer emissivity that depends on a product type of the wafer.

12. A semiconductor device manufacturing method according to claim 8, wherein the estimate expression includes the wafer emissivity that depends on a product type of the wafer.

* * * * *